United States Patent [19]
Saitoh

[11] Patent Number: 5,888,676
[45] Date of Patent: Mar. 30, 1999

[54] PROJECTION-EXPOSURE METHOD FOR MANUFACTURING SEMICONDUCTOR DEVICE AND DEVICES MADE USING SAME

[75] Inventor: Akihiro Saitoh, Tokyo, Japan

[73] Assignee: Nikon Corporation, Japan

[21] Appl. No.: 781,105

[22] Filed: Jan. 9, 1997

[30] Foreign Application Priority Data

Jan. 10, 1996 [JP] Japan ................................ 8-001937

[51] Int. Cl.[6] ............................................... G03F 9/00
[52] U.S. Cl. ............................................. 430/5; 430/311
[58] Field of Search .............................. 430/5, 22, 311, 430/312

[56] References Cited

U.S. PATENT DOCUMENTS

5,523,580   6/1996   Davis ............................................. 430/5
5,674,413  10/1997   Pfeiffer et al. ............................. 430/296

*Primary Examiner*—S. Rosasco
*Attorney, Agent, or Firm*—Klarquist Sparkman Campbell Leigh & Whinston

[57] ABSTRACT

Methods are disclosed for forming, on a semiconductor substrate, a circuit pattern of semiconductor device having a die (field) size larger than the irradiation field achievable using a particular photolithographic exposure system. The circuit pattern is defined by a reticle, but the reticle field is divided into multiple subfields that are projection-exposed onto the substrate in a sequential manner to form, for each die formable on the substrate, the complete circuit pattern in which the subfields are adjacent and aligned with each other. The subfields on the reticle have at least one non-linear boundary to increase the packing density of individual devices of the circuit on the substrate. For example, the non-linear boundaries can be dentate or serpentine. An exemplary application of the method is disclosed for making an image-pickup device for HDTV.

23 Claims, 8 Drawing Sheets

PROJECTION-EXPOSURE METHOD FOR MANUFACTURING SEMICONDUCTOR DEVICE AND DEVICES MADE USING SAME

FIELD OF THE INVENTION

This invention pertains to the manufacture of semiconductor devices using projection exposure of a pattern defined by a reticle onto a sensitive substrate. More specifically, the invention pertains to such projection exposure of device patterns that require more than one subfield on the reticle to define a complete die on the substrate.

BACKGROUND OF THE INVENTION

Integrated circuits (ICs) have played a major role in the miniaturization of electronic circuits and devices incorporating such circuits. ICs generally constitute a combination of multiple active elements (e.g., transistors) and passive elements (e.g., resistors and capacitors) integrated on a semiconductor substrate. In recent years, the integration of ever higher numbers of active and passive elements (both hereinafter referred to simply as "elements") has permitted increased functionality, decreased power consumption, and improved processing speeds of such circuits.

The technology for forming integrated-circuit patterns on semiconductor substrates has advanced rapidly, resulting in a capability of manufacturing progressively smaller elements and other feature sizes. However, reduction in feature size alone does not permit the highest degree of circuit integration. Large semiconductor substrate-surface areas are required to integrate some complex circuit structures and hence device "chip" (i.e., die) sizes have increased as well.

Image-pickup devices (e.g., charge-coupled devices) represent an important example of devices requiring a large chip size, which poses interesting technical challenges. Image-pickup devices for broadcasting television according to the well-established National Television System Committee (NTSC) television format need to sense about 400,000 image points (pixels) in order to allow transmission of an adequate image. A charge-coupled device (CCD) for this application offering the same image quality should have at least the same number (400,000) of light-sensitive elements, each such light-sensitive element termed herein a "pixel". However, broadcast television according to newer High Definition Television (HDTV) standards require an image-pickup device having at least approximately 2,000,000 pixels. It is readily apparent that, in order to accommodate such an increased number of pixels, a CCD for HDTV use will likely require a larger "die" than a CCD for NTSC use, wherein a "die" represents an area occupied by the entire device (i.e., by all the pixels and auxiliary integrated circuitry of the device).

An important process used in manufacturing semiconductor devices is photolithography. In photolithography, a reticle defines a circuit pattern to be projection-transferred to the surface of a sensitized substrate. The circuit pattern on the reticle usually corresponds to an entire die, and the area on the reticle occupied by a pattern for one die is termed a "field". The substrate is "sensitized" usually by applying, before the projection exposure, a layer of a photoresist. The substrate is usually a semiconductor material such as a silicon "wafer". After exposure of the resist layer, usually with multiple dies placed side by side, the wafer is further processed to complete manufacture of the devices on the wafer.

Figure 9:
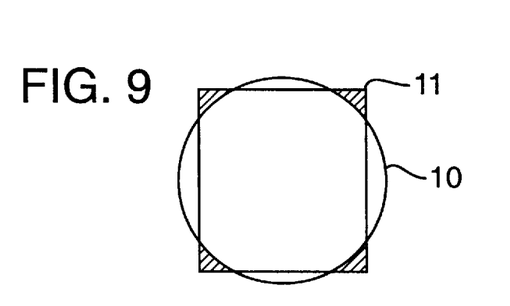
FIG. 9 schematically depicts a possible relationship between a reticle and the maximum exposure field of an exposure device.

Photolithography is normally performed using a projection-exposure apparatus using ultraviolet or other suitable radiation generated by a radiation source. The radiation is passed through the reticle and refracted so as to form the reticle pattern on the semiconductor. As shown in FIG. 9, the maximum exposure area 10 that an exposure apparatus can irradiate is generally limited relative to the area of the die 11 on the reticle. When making a large semiconductor device such as an HDTV image-pickup device, the size of the die 11 may exceed the size of the maximum area 10 of exposure. In such an instance, the die 11 is divided into multiple "subfields" that are sequentially projection-exposed onto the substrate surface in an ordered way to produce the corresponding die on the surface of the substrate. In such an instance, multiple subfields on the reticle are required for each die layer formed on the substrate.

Figure 10:
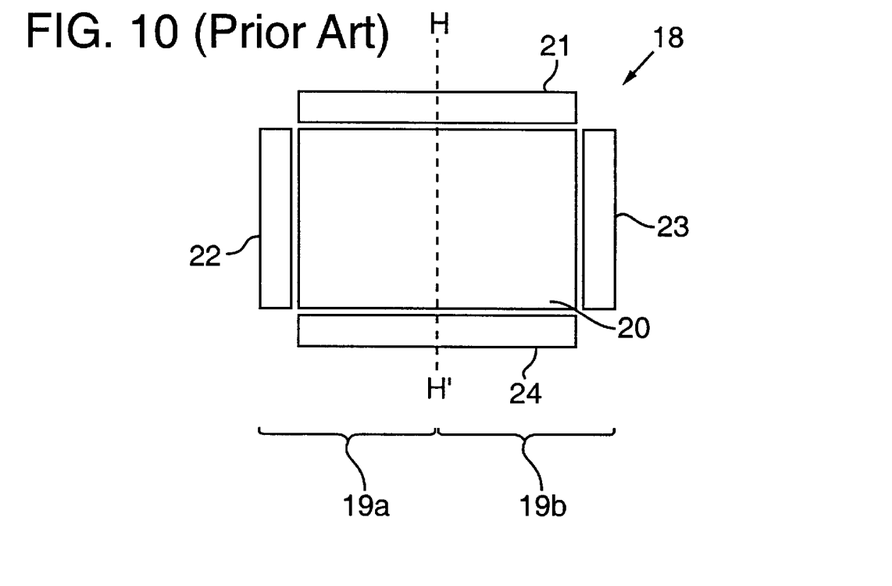
FIG. 10 schematically depicts an example of a prior-art two-subfield exposure for an HDTV image-pickup device.

By way of example, FIG. 10 shows a general profile, on a reticle, of an entire field 18 (corresponding to a die) for an HDTV image-pickup device. The field 18 is divided into two reticle subfields 19a, 19b to be sequentially projected onto a sensitive substrate (i.e., two sequential exposures are required to reproduce the entire field 18 on the substrate surface). As is generally known in the art, an HDTV image-pickup device comprises an array of many pixels (too many to show) arranged in a light-sensitive area 20. Each pixel includes a light-sensitive element, an associated storage element for storing charge generated by exposure of the light-sensitive element to incident light, and a conversion element for converting the stored charge to an electrical signal. The device also includes a horizontal scanning circuit 21 and vertical scanning circuits 22, 23 operable to sequentially select pixels for readout. The device further includes a combined reset, constant-current, and bias circuit 24 in communication with the pixels. All these circuits and elements are defined within the area of the field.

Further with respect to FIG. 10, the field 18 is divided along a boundary line H–H' into two subfields 19a, 19b. To reproduce the complete die on the substrate, the subfields 19a, 19b are sequentially exposed onto corresponding separate but contiguous regions on the substrate surface. When performing multiple exposures in this way to reproduce a die pattern, the subfield exposures must accurately align with each other on the substrate surface. This is especially important with respect to interconnections between subfields that span the boundary line H–H' in FIG. 10.

Figure 11A:
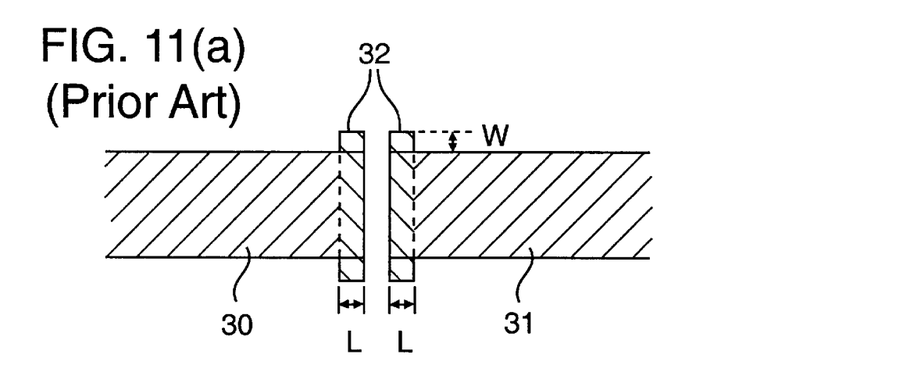
FIG. 11 schematically illustrates an interconnection-alignment-error compensation feature as used in the prior art.
Figure 11B:
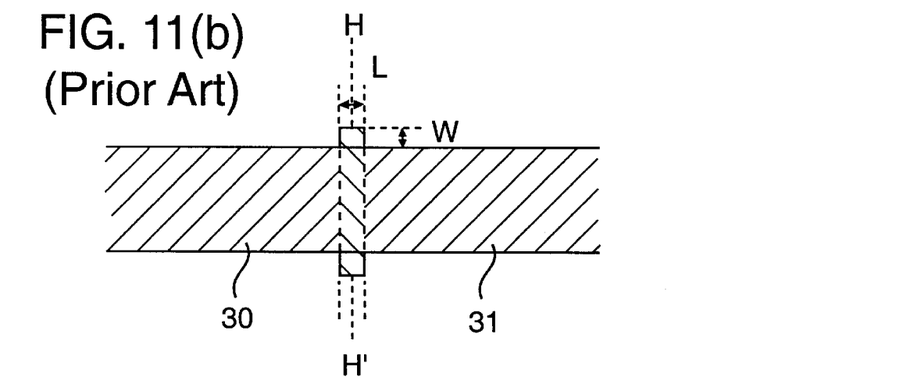

Unfortunately, some alignment errors inevitably arise between adjacent subfield patterns on the substrate surface. Various ways have been devised to alleviate the effects of this problem. For example, as shown in FIG. 11(a), an alignment-error-compensation feature 32 can be provided on each trace 30, 31 at the point where the respective trace 30, 31 crosses the boundary line between adjacent subfields on the reticle. The feature 32 is typically wider by 2W than the corresponding trace 30, 31. The extra width 2W of the feature 32 helps compensate for misalignment by providing an overlap length L. After exposure onto the substrate, adjacent features 32 overlap each other as shown in FIG. 11(b).

Alignment-error-compensation features 32 also prevent narrowing of the corresponding traces on the substrate as the traces span the subfield boundary. Absent the features 32, a trace exhibiting such narrowing can exhibit an undesirable increase in electrical resistance. Narrowing can arise, for example, due to a double exposure that can occur on the substrate along boundaries between adjacent subfields of a die.

During exposure of a substrate, reticle subfields are preferably arranged so that misalignments on the substrate are 0.1 μm or less. Thus, the L and W dimensions of the alignment-error-compensation features are generally between 0.1 μm and 0.3 μm.

Figure 12:
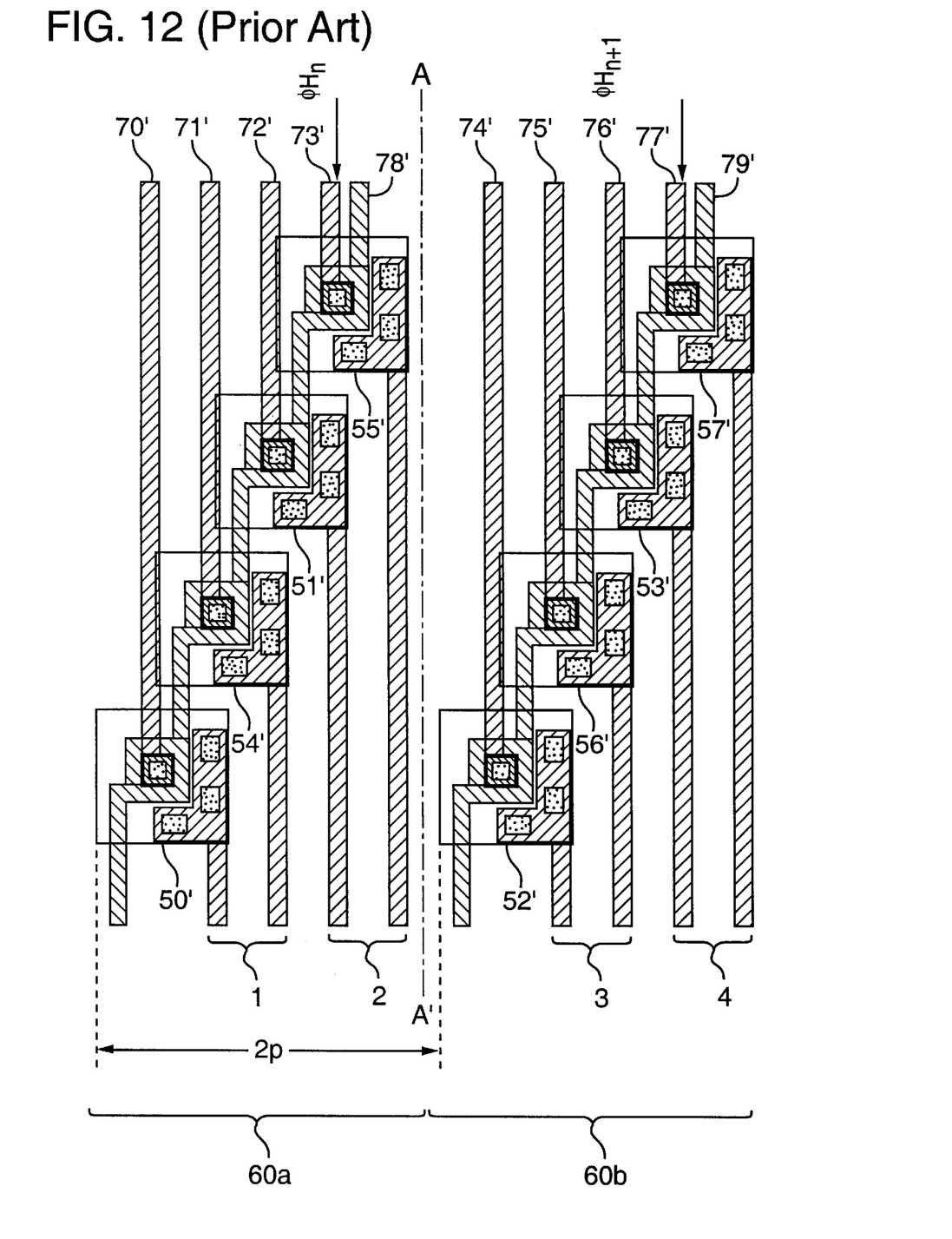
FIG. 12 schematically depicts an example layout of a portion of a prior-art semiconductor device.

In the prior art, projection-exposure apparatus and methods utilize reticles on which the boundaries between subfields are straight lines. FIG. 12 shows a portion of an IC device defined in part by such a reticle. The device comprises MOS-FETs 50'–57' and interconnections 70'–79'. A boundary between adjacent subfields 60a, 60b is designated by the line A–A'. It is not possible to form circuit elements across the actual boundary A–A'. This restricts circuit layout and limits further device miniaturization.

SUMMARY OF THE INVENTION

The invention addresses the foregoing shortcomings of the prior art by providing projection-exposure methods utilizing a reticle on which subfield boundaries include "complex" (i.e., non-linear) profiles. Thus, methods according to the present invention facilitate further miniaturization of semiconductor devices made using multiple reticle-subfield exposures per die. Such methods also permit circuit elements to be placed more compactly relative to each other. Many boundary shapes can be used. For example, the boundary may be dentate or curved.

More specifically, the present invention provides an improved method for forming a circuit pattern on a semiconductor substrate by projection lithography of a circuit pattern defined by a reticle. The improved method comprises three steps. In the first step, the circuit pattern is divided into multiple portions each corresponding to an individual subfield defined by the reticle. In the second step, a reticle is provided that separately defines the individual subfields; at least one of the subfields on the reticle has a non-linear boundary. In the third step, radiation is passed separately through individual subfields on the reticle so as to expose corresponding subfields on the substrate. The resulting subfields that are formed on the substrate are adjacent each other and are aligned with each other. Exemplary non-linear boundaries include, but are not limited to, dentate and serpentine.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIGS. 3(a)–FIGS. 3(j) are timing diagrams for signals used by the HDTV image-pickup device of FIG. 2.

DETAILED DESCRIPTION

Figures 1A, 1B:
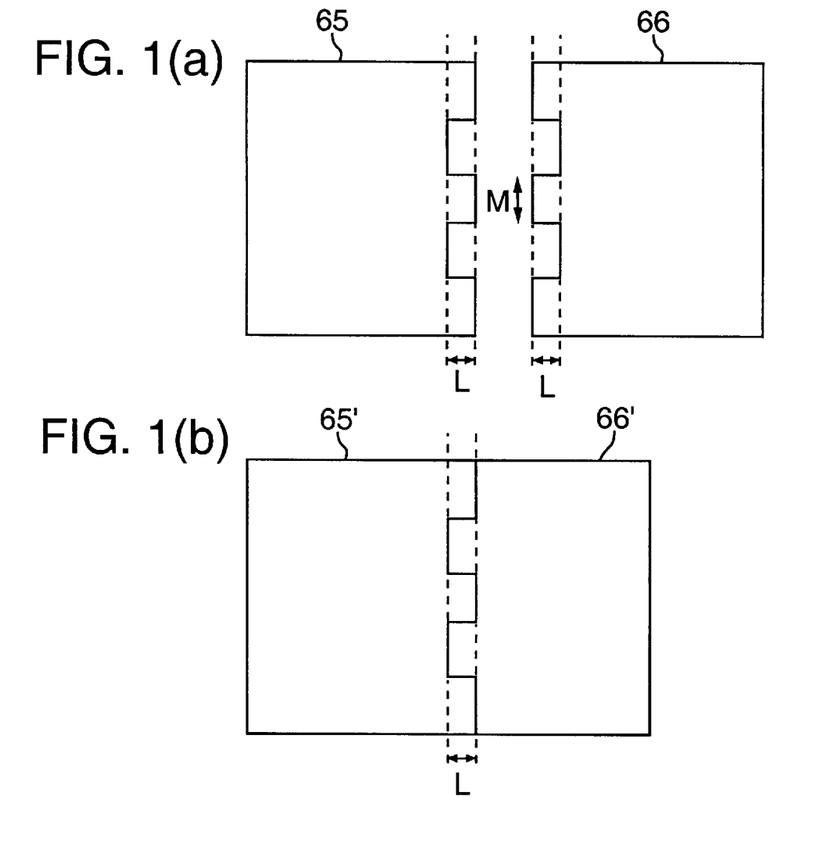
FIGS. 1(a)–1(b) schematically depict an example embodiment of a reticle according to the present invention in which adjacent subfields have a complex-profile border (i.e., a border that, along its full length in any dimension, is not linear).

FIG. 1(a) shows an example embodiment of a complete die on a reticle according to the invention. The die on the reticle is divided into left and right subfields 65, 66, respectively. The right edge of subfield 65 and the left edge of subfield 66 have a toothed profile (as an example of a "complex" profile). Each tooth has a width M and a length L. The teeth in this example are evenly spaced every 2M (however, such even spacing is not required). As shown in FIG. 1(b), exposure on a substrate surface of the complete die is achieved by sequentially exposing the subfields 65, 66 to form corresponding subfields 65'66' on the substrate surface. On the substrate surface, the subfields are placed immediately adjacent each other such that the teeth interdigitate.

An example embodiment of a circuit that can be defined on a substrate using a reticle such as that in FIG. 1(a) is an HDTV image-pickup device as discussed below.

Figure 2:
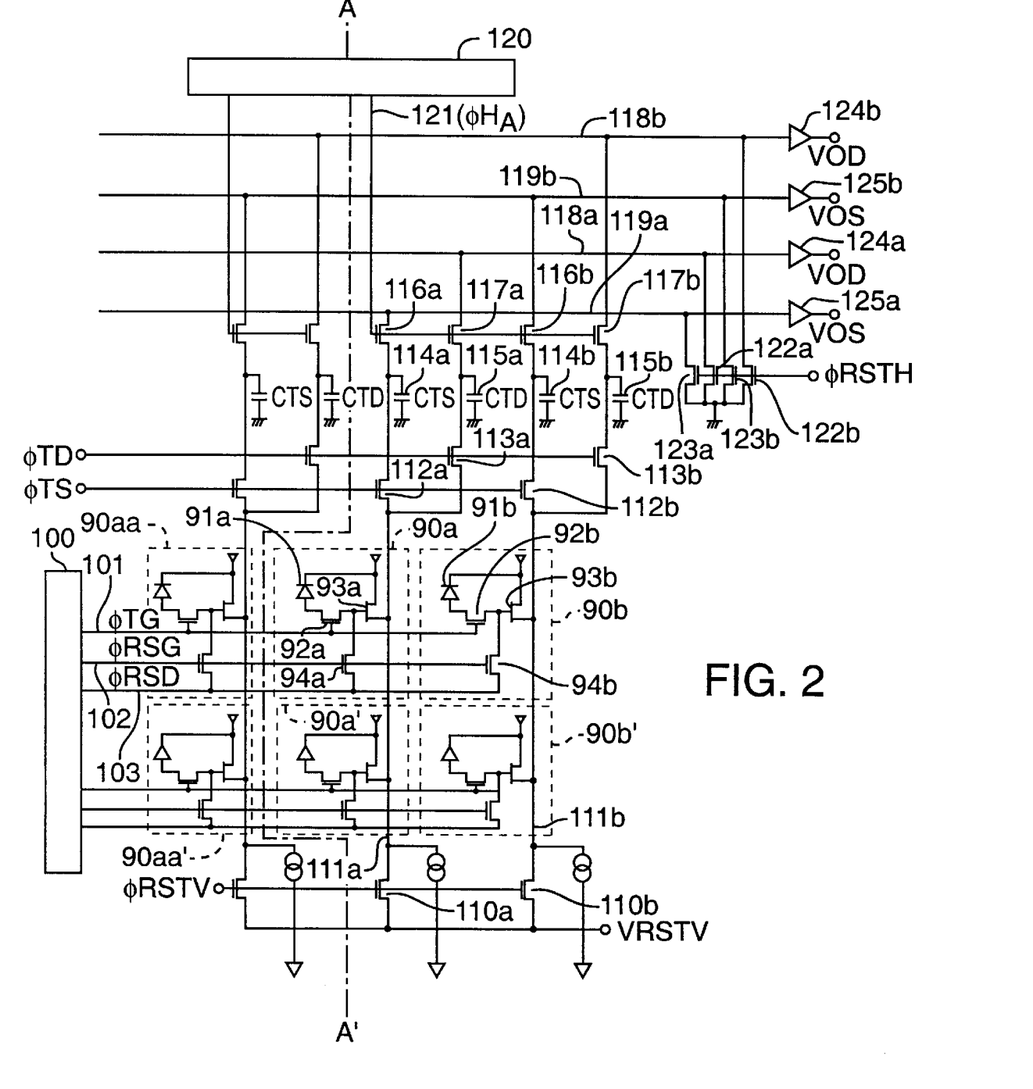
FIG. 2 is a schematic diagram of a portion of a circuit for an HDTV image-pickup device that can be made using a reticle and method according to the present invention.

FIG. 2 shows a portion of a representative circuit for an HDTV image-pickup device. Six picture elements (pixels) 90a, 90b, 90aa, 90a', 90b', 90aa' are shown; an actual HDTV image-pickup device would contain many more pixels than the six that are shown. The circuit also includes a vertical scanner 100 and a horizontal scanner 120.

The pixel 90b has a buried photodiode (BPD) 91b, a junction-field-effect transistor (J-FET) 93b, a p-channel MOS-FET 92b (hereinafter termed QTG 92b), and a p-channel MOS-FET 94b (hereinafter termed QRSG 94b). The p-channel MOS-FETs are used as switches. Other pixels have corresponding circuit elements. For convenience in describing the invention, both the sources and drains of the MOS-FETs will be referred to as "electrodes".

The cathode of BPD 91b is connected to a supply voltage and to the drain of J-FET 93b; the anode of BPd 91b is connected to one of the electrodes of QTG 92b. The other electrode of QTG 92b is connected to the gate of J-FET 93b and to an electrode of QRSG 94b. The source of J-FET 93b is connected to other J-FETs (for example, the J-FET of pixel 90b') via a common source line 111b and to one of the electrodes of MOS-FET 110b (hereinafter termed QRSTV 110b). Other pixels are similarly arranged.

Gate pulses φTG, φRSG control the states ("ON" or "OFF") of QTG 92b and QRSG 94b. The vertical scanner 100 supplies these gate pulses via gate lines 101, 102. The gate of QTG 92b is directly controlled by φTG.

While φRSG establishes the gate voltage of J-FET 93b, the application of this voltage to the J-FET is further controlled by QRSG 94b. QRSG 94b is, in turn, dependent on φRSD via a reset drain line 103.

The MOS-FETs 110a, 110b, 112a, 112b, 113a, 113b, 122a, 122b, 123a, 123b reset either a signal line or a capacitor voltage as required. The MOS-FETs 112a, 112b, 113a, and 113b also select storage capacitors, as described below. In addition, the MOS-FETs 116a, 116b, 117a, and 117b deliver a light signal or a dark signal in synchrony with a drive signal from the horizontal scanner 120 to amplifiers 124a, 124b, 125a, and 125b as shown.

Capacitors are provided to accumulate the light-induced charges acquired by the pixels 90a, 90b (and other similar pixels such as 90a' and 90b'). Signal-storage capacitors 114a, 114b (hereinafter termed CTS 114a, CTS 114b, respectively) accumulate charge in proportion to the magnitude of the incident light. The capacitors are also provided to integrate J-FET noise to aid in the elimination of noise in the light signal. Dark-storage capacitors 115a, 115b (hereinafter termed CTD 115a, CTD 115b, respectively) accumulate charge in proportion to the summed noise. The MOS-FETs 116a, 116b, 117a, 117b switchably connect the storage capacitors to corresponding output amplifiers 124a, 124b, 125a, 125b as shown in FIG. 2. The amplifiers amplify and output the signals accumulated in the storage capacitors CTD 115a, CTD 115b, CTS 114a, CTS 114b, respectively.

The source line 111b connects the source electrode of the J-FET 93b to electrodes of the MOS-FETs 112b, 113b (hereinafter termed QTS 112b, QTD 113b, respectively); the source line 111a similarly connects the source electrode of the corresponding J-FET of pixel 90a to electrodes of the MOS-FETs 112a, 113a (hereinafter termed QTS 112a, QTD 113a, respectively). QTS 112a and QTS 112b are driven by φTS; QTD 113a and QTD 113b are driven by φTD. The remaining electrodes of QTS 112a and QTS 112b are respectively connected to CTS 114a, 114b, and the other electrodes of the horizontal selecting MOS-FETs 116a, 116b (hereinafter termed QHS 116a, QHS 116b, respectively). The other electrodes of QTD 113a, QTD 113b are respectively connected to CTD 115a, CTD 115b and the other electrodes of the horizontal-selecting MOS-FETs 117a, 117b, respectively (hereinafter termed QHD 117a, 117b, respectively).

The gates of QHS 116a, QHS 117a, QHD 117a, and QHD 117b are connected to each other, and are further connected to the horizontal scanner 120 via a horizontal drive line 121. In addition, one electrode of each of QHD 117a, QHD 117b, QHS 116a, and QHS 116b is respectively connected to the other electrodes of each of the horizontal reset MOS-FETs 122a, 122b, 123a, 123b (hereinafter termed QRSTH 122a, QRSTH 123b, QRSTH 123a, and QRSTH 123b) via horizontal read-out lines 118a, 118b, 119a, 119b, respectively, and are also connected to output amplifiers 124a, 124b, 125a, 125b.

Figure 3:
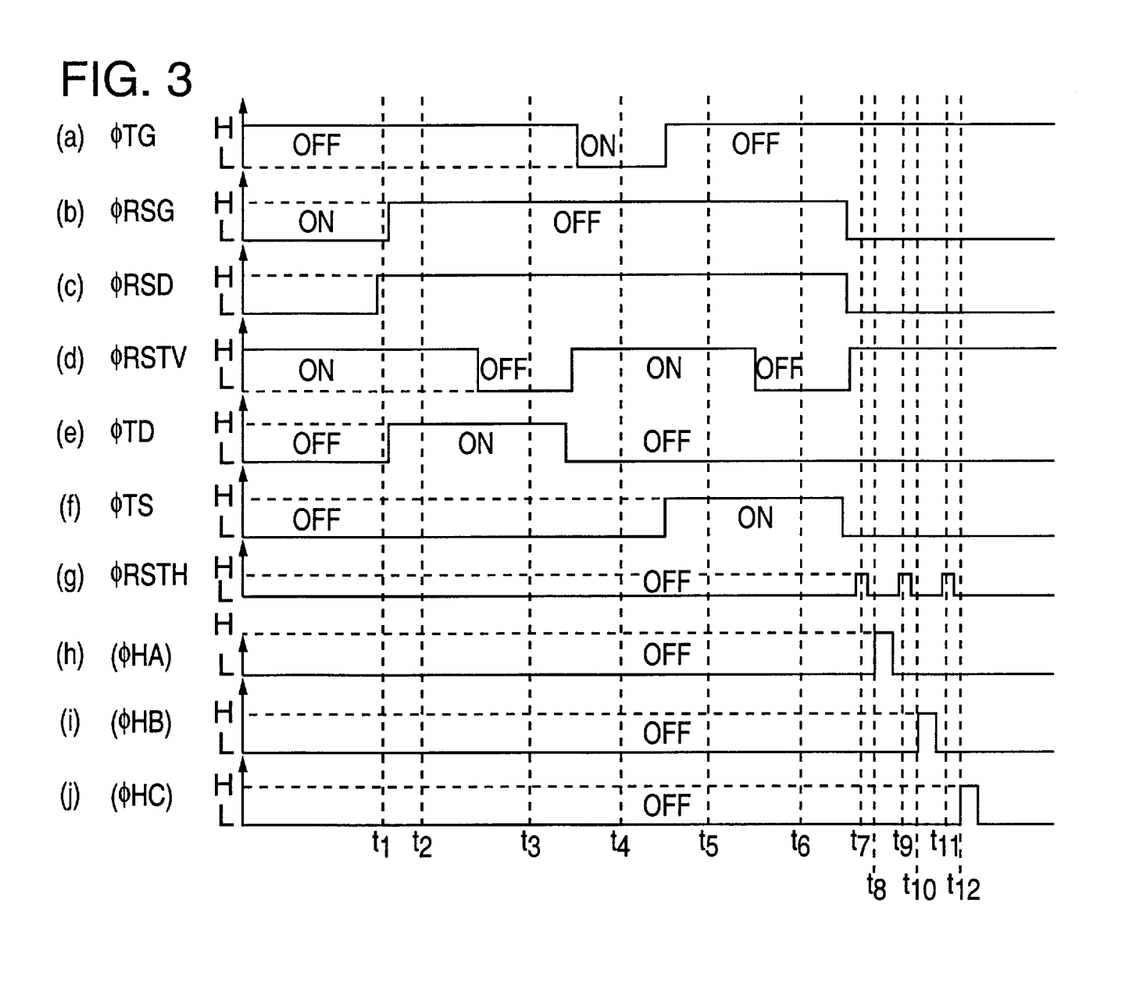

The operation of this circuit may be explained with reference to FIGS. 3(a)–3(j) which show the timing of various control signals. The operation of pixels 90a and 90b will be described; other pixels operate in a similar fashion. As shown in FIG. 3(a), before time $t_1$, φTG is in the "H" state; as a result, QTG 92b in pixel 90b and QTG 92a in pixel 90a are "OFF". As shown in FIG. 3(b), φRSG is in the "L" state before $t_1$; hence, QRSG 94b in pixel 90b and QRSG 94a in pixel 90a are "ON". In FIG. 3(d), because φRSTV is in the "H" state, lines 111a, 111b that connect the sources of the J-FETs in pixels 90a, 90b, respectively, are at the vertical reset potential VRSTV; QRSTV 110a and QRSTV 110b control the application of the reset potential VRSTV to these lines.

At time $t_1$, φRSD changes from "L" to "H", resetting the gate potential of the J-FETs to the "H" state (FIG. 3(c)). Subsequent to time $t_1$, φTD (FIG. 3(e)) changes to the "H" state switching QTD 113a and QTD 113b to the "ON" state. Because QRSTV 110a and QRSTV 110b are on, capacitors CTD 115a and CTD 115b are thus initialized to the voltages on the source lines 111a, 111b, respectively.

Between $t_1$, and $t_2$, φRSTV (FIG. 3(d)) switches from "H" to "L". By time $t_3$, QRSTV 110a and QRSTV 110b have switched to the "OFF" state. BPD 91a and BPD 91b are isolated from J-FETs 93a and 93b by QTG 92a and QTG 92b, respectively, that are still off. The output of the J-FETs now accumulates in CTD 115a and CTD 115b. The accumulated output of the J-FETs with the photodiodes disconnected is a dark signal, i.e. a signal representative of noise and offsets in the circuitry in the absence of light input. The major component of the pixel dark signals is DC offset of the J-FETs; acquisition of the dark signal permits its later elimination.

Between $t_3$ and $t_4$, φTD (FIG. 3(e)) switches to the "L" state causing QTD 113a and QTD 114b to switch to the "OFF" state, thereby disconnecting CTD 115a and CTD 115b from the J-FETs and holding the voltages on the capacitors. Acquisition of dark signals is now complete. In addition, because φRSTV (FIG. 3(d)) changes back the "H" state, QRSTV 110a and QRSTV 110b switch to "ON" and vertical source lines 111a, 111b return to VRSTV. Furthermore, since φTG (FIG. 3(a)) changes to the "L" state, QTG 92b switches to the "ON" state. The photocurrents from BPD 91a and BPD 91b are then transferred to the gates of the respective J-FETs 93a and 93b.

Between $t_4$ and $t_5$, φTG (FIG. 3(a)) and φTS (FIG. 3(f)) switch to "H" and the light-signal-transfer transistors QTS 112a and QTS 112b switch to "ON". The potentials in capacitors CTS 114a and CTS 114b are initialized by QTS 112a and QTS 112b, vertical-source lines 111a and 111b, and QRSTV 110a and QRSTV 110b.

Between $t_5$ and $t_6$, φRSTV (FIG. 3(d)) switches to "L" thereby disconnecting VRSTV from lines 111a and 111b. The photoelectric inputs from BPD 91a and BPD 91b as processed by the respective J-FETs now accumulate on capacitors CTS 114a and CTS 114b.

Between $t_6$ and $t_7$, φTS switches to "L", disconnecting the J-FETs and BPDs from the signal-storage capacitors. Light-signal acquisition is complete and the voltages on the capacitors are held for later readout. φRSG (FIG. 3(b)) returns to "L", switching QRSG 94b to "ON", and resetting the gate voltages of the J-FETs to the state ("L" state) of φRSD (FIG. 3(c)). In addition, φRSTV (FIG. 3(d)) switches to the "H" state and QRSTV 110a and QRSTV 110b switch to "ON", thereby resetting the vertical source lines 111a and 111b to potential VRSTV. Furthermore, φRSTH (FIG. 3(g)) switches to the "H" state, thereby switching QRSTHs 122a, 122b, 123a, 123b to "ON" and resetting the horizontal read-out lines 118a, 118b, 119a, 119b in preparation for reading out the capacitors 114a, 114b, 115a, and 115b.

After the read-out lines are reset, φRSTH (FIG. 3(g)) returns to the "L" state after $t_8$, thereby switching QRSTHs 122a, 122b, 123a, and 123b to "OFF". A horizontal drive pulse φHA (FIG. 3(h)) from the horizontal scanner 120 then drives QHS 116a, QHS 116b, QHD 117a, and QHD 117b into the "ON" state via the horizontal drive line 121. This transfers the voltages on capacitors CTS 114a, CTS 114b, CTD 115a, CTD 115b via the horizontal read-out lines 119a, 119b, 118a, 118b to the output amplifiers 125a, 125b, 124a, and 124b, respectively. After amplification, the signals are output as a VOS (signal voltage) and a VOD (dark voltage) for each pixel.

Operations similar to those above are carried out for additional pixels for times from $t_8$ onward. The sequence is the same as described above. First, the input lines to the output amplifiers are reset by switching RSTH to "H" and back to "L". The light and dark signals stored on capacitors are then transferred to the amplifiers by control pulses such as φHB and φHC (FIG. 3(i) and 3(j)). After all pixels in this row have been read-out, subsequent rows may be read-out (i.e. pixels in the row starting with pixel 90aa').

If each of the pixels 90a and 90b has an area 15.0 μm by 15.0 μm, and the image-pickup device has an array of 1600×1000 pixels, the size of the light-reception region 20 (see FIG. 10) will be approximately 24 mm (1600×15.0 μm) by 15 mm (1000×15.0 μm). Consequently, if a circumferential strip having width of approximately 1 mm around the light-reception region is required for additional circuitry, the device dimensions are approximately 26 mm by 17 mm.

Typical exposure apparatus can expose a field having maximum diameter of approximately 15 mm to 22 mm. This is inadequate to cover a device as large as an HDTV image-pickup device. Consequently, multiple subfield exposures are necessary to manufacture such a device. As shown in FIG. 2, the reticle for such a device can be divided into a right subfield and a left subfield by the boundary A–A'. A reticle having both subfields is used to expose the substrate.

For the purpose of explaining the present invention, the division of patterns for the horizontal selection MOS-FETs (e.g., QHS 116a, QHS 116b, QHD 117a, and QHD 117b) so as to define separate reticle subfields along boundary A–A' as shown in FIG. 2, and the connection of these patterns on the substrate will be described.

Figure 4:
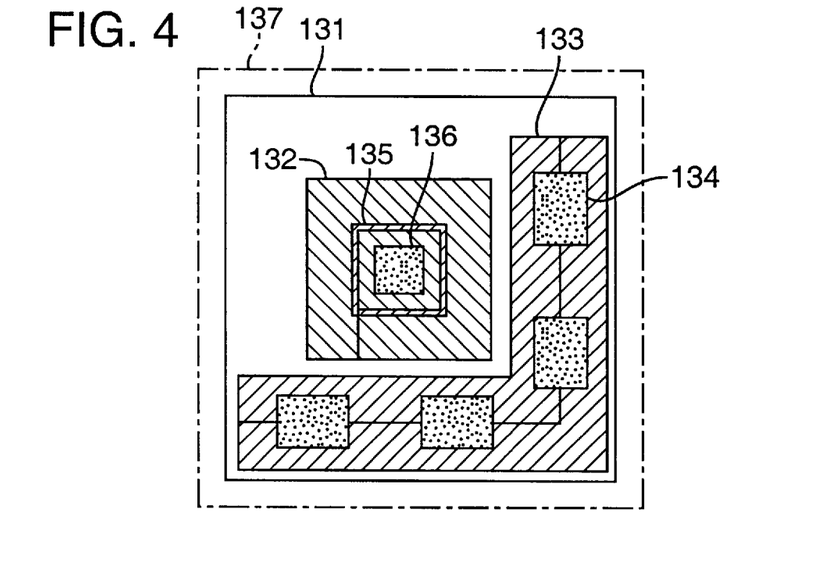
FIG. 4 is schematic plan layout of a single MOS-FET as used in the HDTV image-pickup device of FIG. 2.

FIG. 4 is an example layout of a MOS-FET as fabricated on a semiconductor substrate. The MOS-FET has an active region 131 defining an area in which the device will be formed. The MOS-FET also comprises a polysilicon gate electrode 132, an aluminum electrode 133 for signal input, a contact hole 134 for electrically contacting the semiconductor substrate, an aluminum electrode 135 for signal output, and an ion-bombardment field 137 for forming a self-aligned source/drain N+ field after formation of the polysilicon 132. Item 136 is a contact hole for electrically contacting an under portion of the aluminum electrode 135.

The polysilicon gate electrode 132 is shaped as shown for the following reason. Loads corresponding to the light and dark signals accumulated in the capacitors are output via output amplifiers when QHS 116a, QHS 116b, QHD 117a, and QHD 117b are switched to the "ON" state. If there are parasitic capacitances associated with the horizontal read-out lines, some of the charge accumulated on capacitors 115a, 115b, 114a, and 114b will exhibit a parasitic-capacitance effect and the output-signal levels will decrease. Hence, minimizing parasitic capacitances improves signal output and the sensitivity of the image-pickup device. The shape of the polysilicon gate electrode 132 reduces the surface area of the N+ diffusion field connected to the QHS MOS-FETs and reduces parasitic capacitance.

Figure 5:
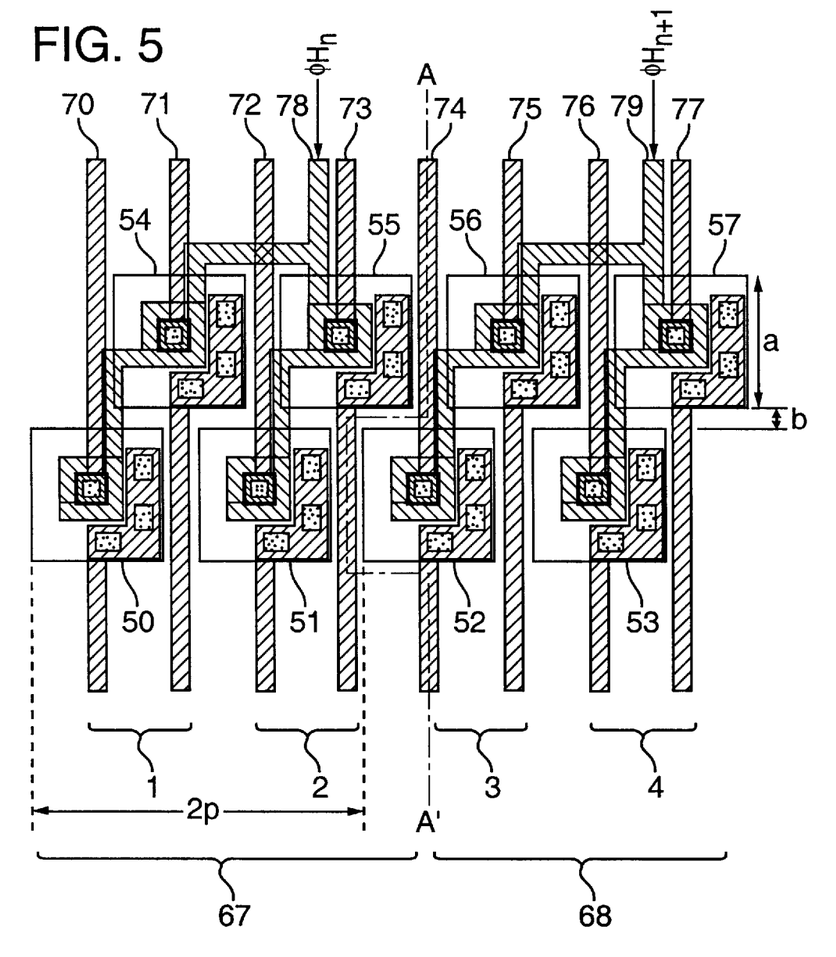
FIG. 5 is schematic plan layout of a portion of an HDTV image-pickup device that can be made using a reticle and method according to the invention, the portion including a boundary between two subfields.

FIG. 5 shows an example layout in which the horizontal-selection MOS-FETs and interconnections shown in FIG. 2 have been divided into two subfields 67, 68 by the boundary A–A' (i.e., on a reticle, the subfields 67, 68 would be separate from each other). MOS-FETs 50–53 switch the light signals from pixels 1–4, respectively (corresponding to a row of pixels as shown in FIG. 2) to output amplifiers. These MOS-FETs correspond to QHS 116a, QHS 116b, and similar MOS-FETs of two other pixels. MOS-FETs 54–57 switch the dark signals to output amplifiers, corresponding to QHD 117a, QHD 117b and similar MOS-FETs of two other pixels as shown in FIG. 2. As is apparent from FIG. 2, these same MOS-FETs control the read-out of other rows of pixels in cooperation with the vertical scanner 100.

Interconnections 70–77 are conductor traces, typically made of aluminum or another metal. The interconnections 70, 72, 74, and 76 correspond to horizontal read-out lines 119a and 119b of FIG. 2. These lines connect light signals from MOS-FETs 50–53 to output amplifiers. In addition, interconnections 71, 73, 75, and 77 correspond to horizontal read-out lines 118a and 118b of FIG. 2. These lines connect dark signals to output amplifiers. Additionally, interconnections 78, 79 (corresponding to horizontal drive lines such as line 121 of FIG. 2) are formed of polysilicon and are connected to the polysilicon gate electrodes 132 of MOS-FETs 50, 51, 54, and 55, and MOS-FETs 52, 53, 56, 57, respectively.

Furthermore, the MOS-FETs 50, 51, 54, and 55 are switched by the horizontal drive pulse $\phi H_n$ (corresponding to $\phi H_A$ of FIG. 3) and switch to permit signal read-out (both light and dark signals) from pixels 1 and 2. MOS-FETs 52, 53, 56, 57 are switched by the horizontal drive pulse $\phi H_{n+1}$ (corresponding to $\phi H_B$ of FIG. 3) and switch to permit signal read-out from pixels 3 and 4.

The distance from the left edge of MOS-FET 50 to the left edge of MOS-FET 52 is equal to 2 times the pitch P of the unit pixels 90 (=2P).

The dentate boundary A–A' defines the complex boundary between subfields 67 and 68. The dentate boundary A–A' does not pass through MOS-FETs but rather skirts around them. If the boundary were straight, then MOS-FET 52 would be bisected.

In the prior-art method shown in FIG. 12, MOS-FETs 50', 51', 54', and 55' are arranged so that their horizontal width is 2P. They have a diagonal arrangement as shown to keep the boundary A–A' a straight line. FIG. 5, in contrast, shows an example embodiment according to the invention in which MOS-FETs 50–57 are arranged in two rows. This is possible because the boundary A–A' need not be straight but rather can be a complex profile such as dentate as shown.

The FIG. 5 layout also reduces the parasitic capacitances of interconnections 70–77 (corresponding to horizontal read-out lines 118a, 118b and 119a, 119b shown in FIG. 2). This, in turn, increases the sensitivity of an image-pickup device as shown in FIG. 5. In other words, in FIG. 5, the interconnections are kept as short as possible. In the prior-art example of FIG. 12, in contrast, the interconnections 70', 71', 74', and 75' are especially long in view of the arrangement of MOS-FETs 50'–57' on a diagonal. Because MOS-FETs 50–57 are arranged compactly in two rows in FIG. 5, interconnection capacitance is reduced, and device sensitivity is correspondingly increased.

Figure 6A:
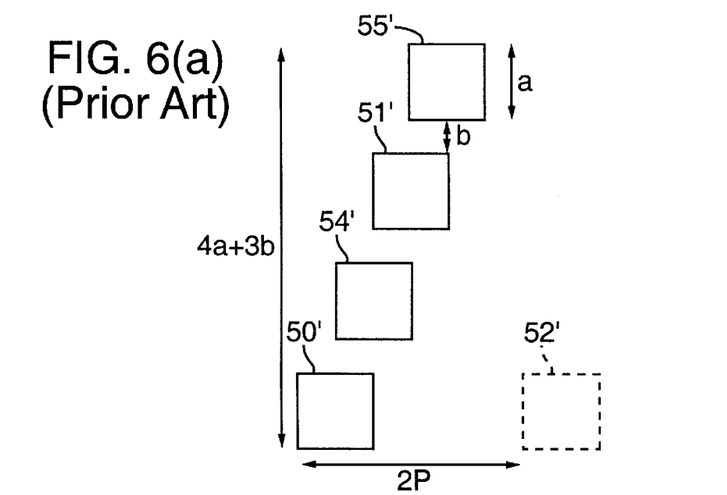
FIG. 6(a) schematically depicts relative positions of multiple MOS-FETs in a prior-art layout of such devices for an image-pickup device.
Figure 6B:
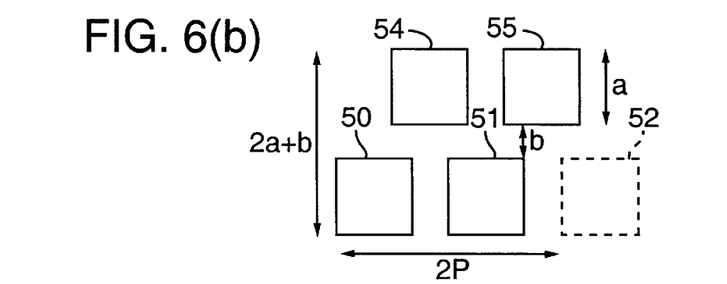
FIG. 6(b) schematically depicts relative positions of multiple MOS-FETs in an example layout of such devices that can be achieved using a method according to this invention.

FIGS. 6(a)–6(b) more simply show the layout of FIG. 12 and FIG. 5, respectively. FIG. 6(a) shows the prior-art layout with MOS-FETs 50', 54', 51', 55'. If the height of each MOS-FET is a and the spacing between each MOS-FET is b, then the four MOS-FETs 50', 51', 54', and 55' have a total height of 4a+3b. When the corresponding MOS-FETs 50, 54, 51, 55 are arranged according to the present invention as shown in FIG. 6(b), the MOS-FETs can be much closer together. As shown in FIG. 6(b), the total height required by the improved layout of this invention is 2a+b, a distance that is 2a+2b less than the prior-art layout of FIG. 6(a). Consequently, the complete device can be made smaller and more compact than in the prior art. The total width of the four MOS-FETs is the pixel horizontal spacing 2P, which is the same for both FIG. 6(a) and FIG. 6(b).

Figure 7:
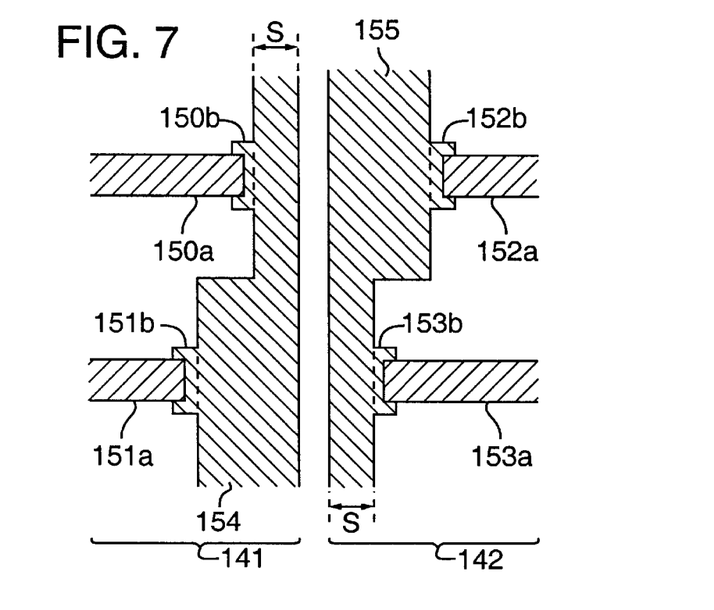
FIG. 7 shows portions of adjacent subfields, specifically highlighting a representative connection of traces with each other at the subfield boundary.

FIG. 7 shows a portion of a boundary between two reticle subfields according to this invention. Subfields 141 and 142 comprise circuit patterns, e.g. patterns used to form the circuit of FIG. 2. A dentate boundary separates the left and right subfields. The features 150a, 151a, 152a, and 153a define interconnections between elements. Alignment-error compensation features 150b, 151b, 152b, and 153b compensate for subfield-alignment errors, reducing the likelihood of short circuits in the interconnections and narrow interconnection conductor runs caused by multiple exposures.

Reducing projection-exposure devices generally do not provide a means for precisely limiting the area of exposure. The subfield bands 154, 155 prevent the transmission of light around the edges of the subfields. The minimum width S of the subfield bands is preferably 6 mm or more to prevent unintended exposure.

Whereas the circuit used to exemplify the invention is an HDTV image-pickup device, the invention is applicable to any device exposed and formed using a reticle comprising multiple subfields. Similarly, whereas the example embodiment pertained to a reticle comprising two subfields, it will be readily apparent that the invention is generally applicable to reticles having multiple subfields. Furthermore, whereas in the example embodiment the subfield boundary is dentate, the invention is not limited to such a shape.

Figures 8A, 8B:
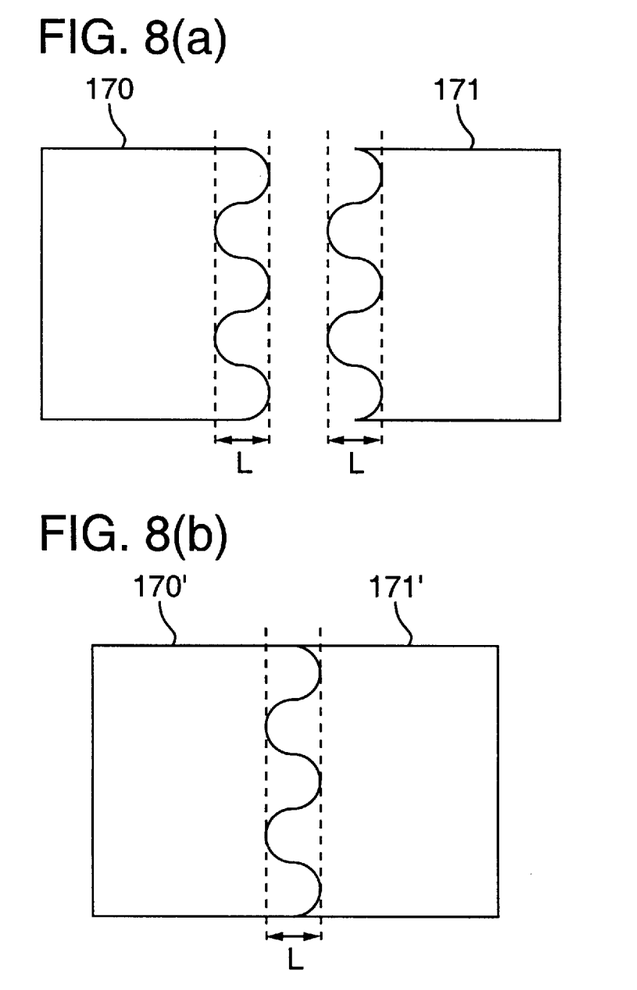
FIGS. 8(a)–8(b) schematically depict an alternative embodiment of a reticle according to the present invention in which adjacent subfields have a complex-profile border.

For example, the subfield boundary may have a serpentine shape shown in FIGS. 8(a)–8(b). The circuit pattern is divided into left and right subfields 170 and 171, respectively, by a serpentine boundary as shown in FIG. 8(a). The circuit pattern on the substrate is made by joining these subfields as shown in FIG. 8(b).

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. In a method for forming a circuit pattern on a semiconductor substrate by projection lithography of a circuit pattern defined by a reticle onto a surface of the substrate, an improvement comprising the steps:
   (a) dividing the circuit pattern into multiple portions each corresponding to an individual subfield defined by the reticle;
   (b) providing a reticle separately defining the individual subfields, at least one of the subfields on the reticle having a boundary that is non-linear;
   (c) passing radiation separately through individual subfields on the reticle so as to expose corresponding subfields on the substrate, the subfields on the substrate being adjacent and aligned with each other and having a non-linear boundary therebetween so as to form the circuit pattern on the substrate.

2. The method of claim 1, wherein step (b) further comprises forming an alignment-error-compensation feature on a boundary of a subfield that, in step (c), will form a boundary between adjacent subfields on the substrate surface.

3. A semiconductor device made using the method of claim 2.

4. The method of claim 1, wherein the non-linear boundary is dentate.

5. A semiconductor device made using the method of claim 4.

6. The method of claim 1, wherein the non-linear boundary is serpentine.

7. A semiconductor device made using the method of claim 6.

8. A semiconductor device made using the method of claim 1.

9. The method of claim 1, wherein the circuit pattern comprises patterns for an image pick-up device.

10. A reticle for forming a circuit pattern on a semiconductor substrate, the reticle defining a circuit pattern separated into multiple subfields including a non-linear boundary and each defining a separate portion of the circuit pattern to be transferred by projection exposure to a substrate, the subfields including a non-linear boundary as projected onto the substrate along which the subfields will be situated adjacent each other on the substrate.

11. The reticle of claim 10, wherein the non-linear boundary is dentate.

12. The reticle of claim 10, wherein the non-linear boundary is serpentine.

13. The reticle of claim 10, wherein the non-linear boundary includes one or more alignment-error-compensation features.

14. The reticle of claim 13, wherein the non-linear boundary is dentate.

15. The reticle of claim 13, wherein the non-linear boundary is serpentine.

16. The reticle of claim 10, wherein the reticle defines circuit patterns for an image pick-up device.

17. A reticle for forming a circuit pattern comprising an array of pixels on a semiconductor substrate, the reticle defining a circuit pattern separated into multiple subfields each defining a separate portion of the circuit pattern to be transferred by projection exposure to a substrate, the subfields including a non-linear boundary on the reticle that is projected as a non-linear boundary on the substrate and along which the subfields will be situated adjacent each other on the substrate.

18. In a method for forming a circuit pattern on a semiconductor substrate by projection lithography of a circuit pattern defined by a reticle onto a surface of the substrate, the circuit pattern including an array of circuit element patterns, an improvement comprising the steps:
   (a) dividing the circuit pattern into multiple portions each corresponding to an individual subfield, each subfield containing a plurality of the circuit element patterns;
   (b) providing a reticle defining the individual subfields, at least one of the subfields on the reticle having a boundary that is non-linear so as to skirt around one or more circuit element patterns rather than pass through a circuit element pattern;
   (c) passing radiation separately through individual subfields on the reticle so as to expose corresponding subfields on the substrate, the subfields on the substrate being adjacent and aligned with each other and having a non-linear boundary therebetween so as to form the circuit pattern on the substrate.

19. The method of claim 18 wherein each circuit element pattern comprises a pattern for a pixel of an image pick-up device.

20.. The method of claim 18 wherein each circuit element pattern comprises patterns for MOS-FETs.

21. A reticle for forming a circuit pattern containing an array of circuit element patterns on a semiconductor substrate, the reticle defining a circuit pattern separated into multiple subfields each including a non-linear boundary and each defining a separate portion of the circuit pattern to be transferred by projection exposure to a substrate, each subfield containing a plurality of the circuit element patterns, the subfields including a non-linear boundary as projected onto the substrate along which the subfields will be situated adjacent each other on the substrate.

22. The reticle of claim 21 wherein the circuit element patterns contain patterns for pixels of an image sensor.

23. The reticle of claim 21 wherein the circuit element patterns contain patterns for MOS-FETs.

* * * * *

UNITED STATES PATENT AND TRADEMARK OFFICE
CERTIFICATE OF CORRECTION

PATENT NO. : 5,888,676
DATED : March 30, 1999
INVENTOR(S) : Akihiro Saitoh

It is certified that error appears in the above-identified patent and that said Letters Patent is hereby corrected as shown below:

Column 3, line 59, insert --a-- between "is" and "schematic".

Column 3, line 61, insert --a-- between "is" and "schematic".

Column 4, line 33, insert a comma --,-- between "65'" and "66'".

Column 4, line 56, "BPd" should be --BPD--.

Column 5, line 37, "CTS 114a, 114b" should be --CTS 114a, CTS 114b--.

Column 5, line 43, "QHD 117a, 117b" should be --QHD 117a, QHD 117b--.

Column 5, line 45, "QHS 117a" should be --QHS 116b--.

Column 6, line 6, "t₁" should be --$t_1$--.

Column 6, line 24, "QTD 114b" should be --QTD 113b--.

Column 10, line 66, claim 20, delete the second period ".".

Signed and Sealed this

Eighth Day of February, 2000

Attest:

Q. TODD DICKINSON

*Attesting Officer*  *Commissioner of Patents and Trademarks*